United States Patent
Lai

(10) Patent No.: US 6,650,544 B1
(45) Date of Patent: Nov. 18, 2003

(54) INTEGRATED CIRCUIT CHIP COOLING STRUCTURE WITH VERTICAL MOUNTING THROUGH HOLES

(75) Inventor: Yaw-Huey Lai, Chung Hu (TW)

(73) Assignee: Tai-Sol Electronics, Co., Ltd., Taipei Hsien (TW)

( * ) Notice: Subject to any disclaimer, the term of this patent is extended or adjusted under 35 U.S.C. 154(b) by 0 days.

(21) Appl. No.: 10/245,361

(22) Filed: Sep. 18, 2002

(30) Foreign Application Priority Data

Jul. 26, 2002 (TW) ...................................... 91211493 U

(51) Int. Cl.[7] .............................................. H05K 7/20
(52) U.S. Cl. ...................... 361/700; 361/699; 361/704; 361/719; 174/15.2; 165/80.4; 165/104.26; 165/104.21
(58) Field of Search ................................. 361/699, 700, 361/704, 719–721; 257/706, 714, 715, 718; 174/15.1, 15.2; 165/80.3

(56) References Cited

U.S. PATENT DOCUMENTS

| | | | | |
|---|---|---|---|---|
| 4,047,198 A | * | 9/1977 | Sekhon et al. ............... | 257/713 |
| 5,757,621 A | * | 5/1998 | Patel ........................... | 361/719 |
| 5,880,524 A | * | 3/1999 | Xie .............................. | 257/704 |
| 6,082,443 A | * | 7/2000 | Yamamoto et al. .... | 165/104.26 |
| 6,263,959 B1 | * | 7/2001 | Ikeda et al. ............ | 165/104.26 |
| 6,302,192 B1 | * | 10/2001 | Dussinger et al. ...... | 165/104.26 |
| 6,356,448 B1 | * | 3/2002 | DiBene et al. .............. | 361/721 |
| 6,535,386 B2 | * | 3/2003 | Sathe et al. ................. | 361/700 |

* cited by examiner

Primary Examiner—Boris Chervinsky
(74) Attorney, Agent, or Firm—Bacon & Thomas, PLLC

(57) ABSTRACT

An integrated circuit chip cooling structure is constructed to include a top plate member and a bottom plate member bonded together and defining a vapor chamber between said top and bottom plate member, the top and bottom plate members each having a plurality of through holes connecting members supported between the top and bottom plate members, each connecting member having a center through hole, a heat sink bonded to the top surface of the top plate member, the heat sink having a plurality of mounting holes for connection to the through hole of each connecting member and respective mounting holes of an external circuit board by respective screw bolts, and an internally sintered metal capillary wick provided within the vapor chamber.

8 Claims, 6 Drawing Sheets

INTEGRATED CIRCUIT CHIP COOLING STRUCTURE WITH VERTICAL MOUNTING THROUGH HOLES

BACKGROUND OF THE INVENTION

1. Field of the Invention

The present invention relates. to an integrated circuit chip cooling structure for cooling an integrated circuit chip and, more specifically, to an integrated circuit chip cooling structure with vertical mounting through holes.

2. Description of the Related Art

Heat and heat sink are commonly used in advanced computers or electronic apparatus. to dissipate heat from an integrated circuit chip, for example, the CPU, for the advantage of superior heat transfer efficiency. U.S. Pat. No. 6,302,191, entitled "Integrated circuit heat pipe heat spreader with through mounting holes", shows an example. According to this design, the heat pipe is held tightly against the heat source by mounting holes, which penetrate the structure of the heat pipe but are sealed off from the vapor chamber because they each are located within a sealed structure such as a pillar or the solid layers of the casing surrounding the vapor chamber. This design is still not satisfactory in function. Because of the weak structural strength in the area around the mounting holes, the mounting holes of the heat spreader are not practical for fastening to a circuit board by screws. When fastened to the heat sink, the heat pipe heat spreader tends to be deformed by external force.

SUMMARY OF THE INVENTION

The present invention has been accomplished to provide an integrated circuit chip cooling structure with vertical mounting through holes, which eliminates the aforesaid drawback. It is therefore the main object of the present invention to provide an integrated circuit chip cooling structure with vertical mounting through holes, which achieves a satisfactory heat sink fixation effect. It is another object of the present invention to provide an integrated circuit chip cooling structure, which has a strong structural strength that achieves high connection stability when installed. To achieve these and other objects of the present invention, the integrated circuit chip cooling structure comprises a top plate member, the top plate member having an edge lip that bounds a top surface and a bottom surface; a bottom plate member, the bottom plate member having an edge lip that bounds a top surface and a bottom surface, the edge lips of the top and bottom plate members being bonded together so as to define a vapor chamber between the top and bottom plate member; wherein the top plate member and the bottom plate member each have at least one through hole, the at least one through hole of the top plate member and the at least one through hole of the bottom plate member being respectively vertically aligned; at least one connecting member provided between the top plate member and the bottom plate member corresponding to the at least one through hole of the top and bottom plate members and peripherally sealed to the periphery of the at least one through hole of the top and bottom plate members, the at least one connecting member each having a top end, a bottom end, and a through hole extended through the top and bottom ends; at least one heat sink, the at least one heat sink each having a bottom surface attached to the top surface of the top plate member and at least one mounting hole respectively connected to the through hole of the at least one connecting member; and an internally sintered metal capillary wick provided within the vapor chamber.

DETAILED DESCRIPTION OF THE PREFERRED EMBODIMENT

Figure 1:
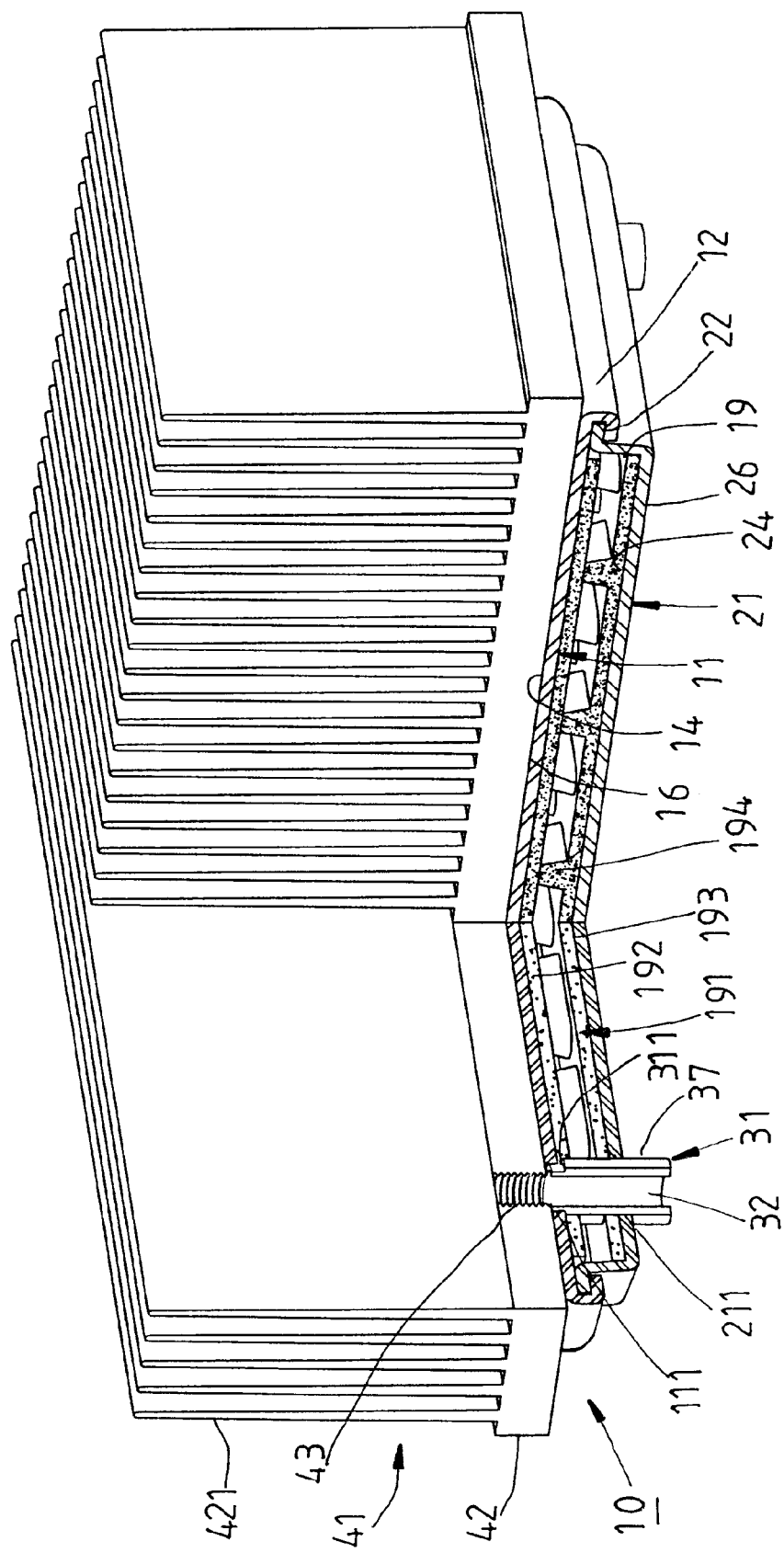
FIG. 1 is a sectional elevation of an integrated circuit chip cooling structure constructed according to the first embodiment of the present invention.
Figure 2:
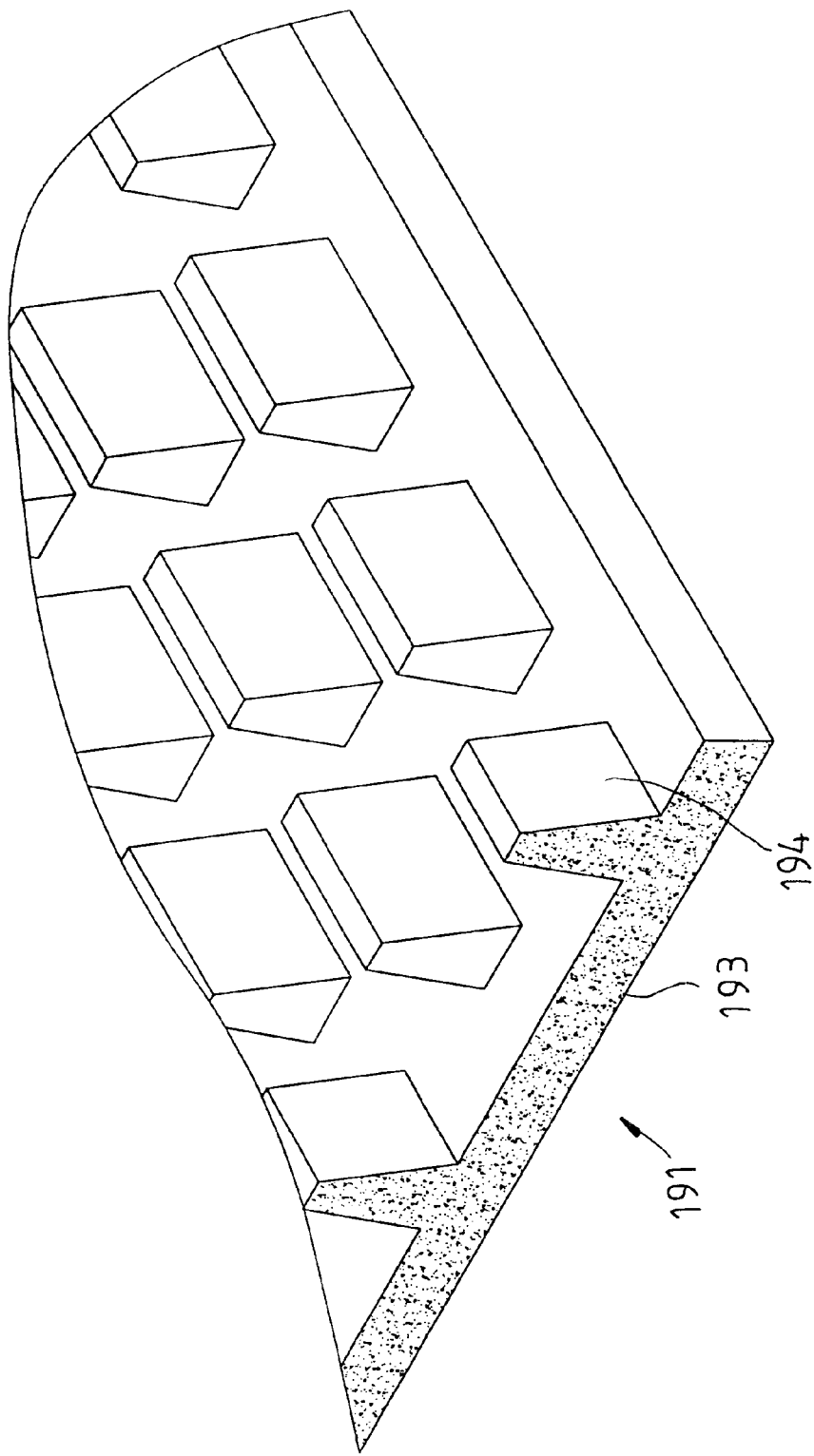
FIG. 2 is an enlarged view of a part of the first embodiment of the present invention, showing the structure of the internally sintered metal capillary wick.

Referring to FIGS. 1 and 2, an integrated circuit chip cooling structure 10 in accordance with the first embodiment of the present invention is shown comprised of a top plate member 11, a bottom plate member 21, a plurality of connecting members 31, and a heat sink 41.

The top plate member 11 has an edge lip 12 that bounds a top surface 14 and a bottom surface 16.

The bottom plate member 21 has an edge lip 22 that bounds a top surface 24 and a bottom surface 26. The edge lip 22 of the bottom plate member 21 is bonded to the edge lip 12 of the first plate member 11 so as to define a vapor chamber 19 between the top plate member 11 and the bottom plate member 21. An internally sintered metal capillary wick 191 is provided within the vapor chamber 19. The internally sintered metal capillary wick 191 is comprised of an upper plate-like wick element 192 located on the bottom surface 16 of the top plate member 11, a bottom plate-like wick element 193 located on the top surface 24 of the bottom plate member 21, and a plurality of vertical wick element 194 provided between the upper plate-like wick element 192 and the bottom plate-like wick element 193. The vertical wick elements 194 each have a bottom side integral with the bottom plate-like wick element 193, and a top side stopped at the bottom side of the top plate-like wick element 192. The top plate-like wick element 192, the bottom plate-like wick element 193, and the vertical wick elements 194 define a liquid passage. The space between the top plate-like wick element 192 and the bottom plate-like wick element 193 serves as an air passage. Therefore, the whole structure of the top plate member 11, the bottom plate member 21, and the internally sintered metal capillary wick 191 is convenient for conversion between liquid phase and vapor phase.

The top plate member 11 has a plurality of through holes 111. The bottom plate member 21 has a plurality of through holes 211 corresponding to the through holes 111 of the top plate member 11. The connecting members 31 each have a center through hole 32 through the respective two distal ends. The connecting members 21 are respectively peripherally sealed to the periphery of the through holes 111 and 211 of the plate members 11 and 21 to isolate the vapor chamber 19 from the atmosphere. The top and bottom ends of each connecting member 31 are respectively perpendicularly inserted through the top plate-like wick element 192 and the bottom plate-like wick element 193. Each connecting member 31 has a top shoulder 311 tightly stopped at the bottom surface 16 of the top plate member 11. The bottom end of each connecting member 31 extends downwardly out of the bottom plate member 21 at a distance, forming a foot 37.

The heat sink 41 is comprised of a base panel 42 and a plurality of radiation fins 421 located on one side of the base panel 42. The base panel 42 has a plurality of mounting holes 43. According to this embodiment, the mounting holes 43 are screw holes. The bottom panel 42 of the heat sink 41 is closely attached to the top surface 14 of the top plate member 11, keeping the mounting holes 43 respectively aimed at the connecting members 31.

Figure 3:
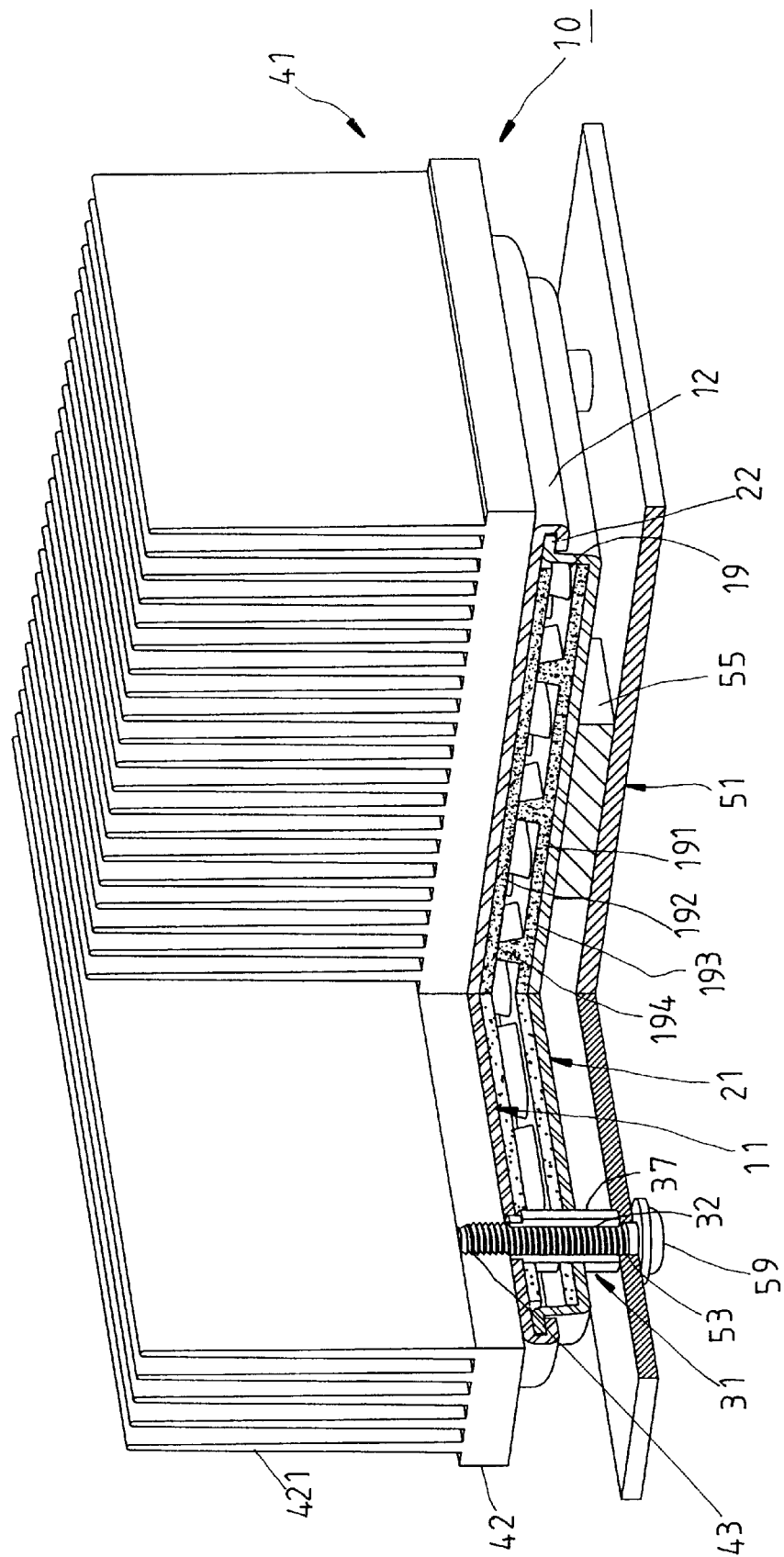
FIG. 3 shows an application example of the first embodiment of the present invention.
Figure 4:
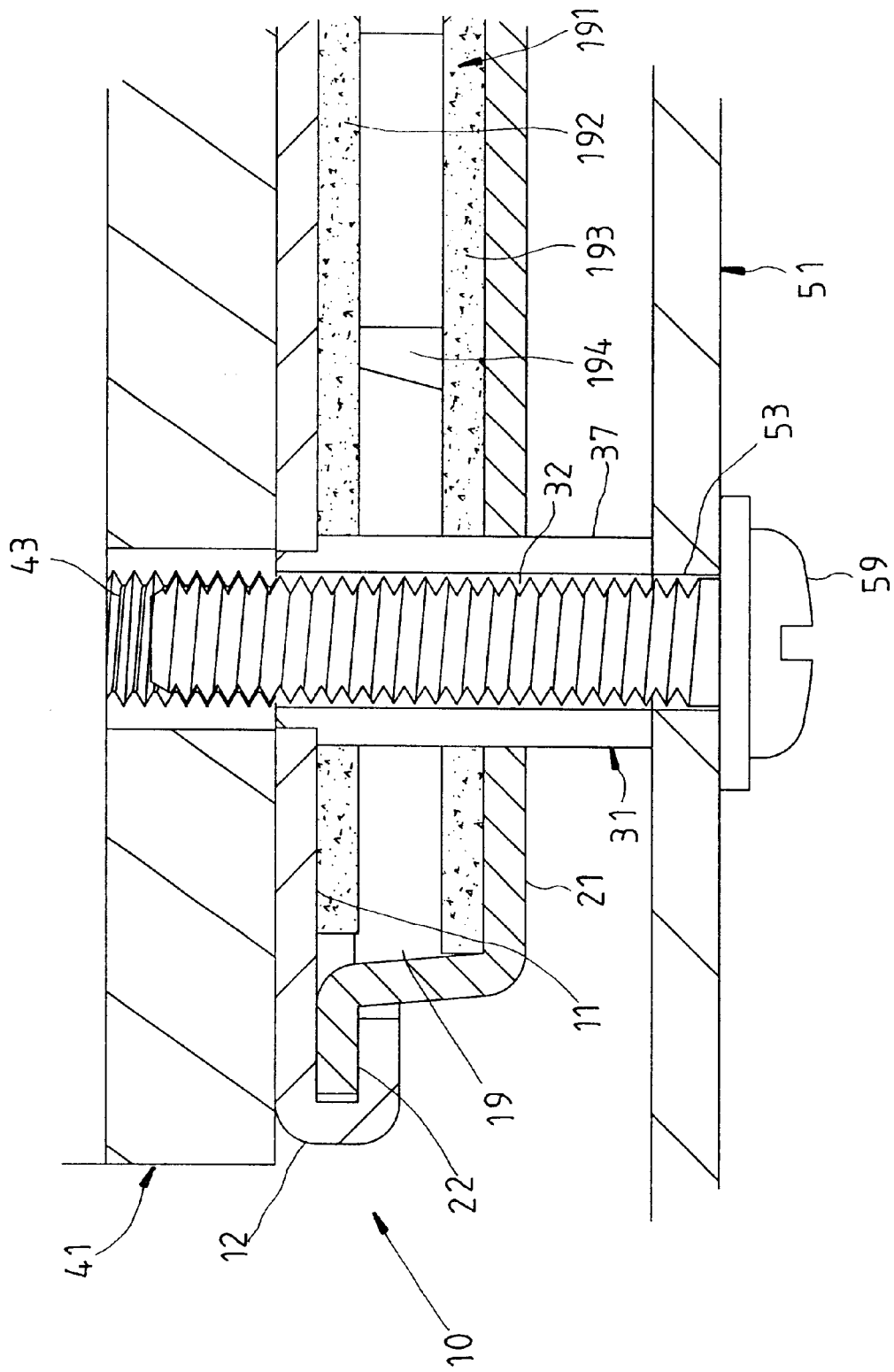
FIG. 4 is an enlarged view of a part of FIG. 3.

Referring to FIGS. 3 and 4, because of the arrangement of the connecting members 31, the integrated circuit chip cooling structure 10 has a strong mounting structure on the outside for the installation of fasteners such as screws 59 to fix the integrated circuit chip cooling structure 10 to a heat source (see FIG. 3). Further, the structure of the internally sintered metal capillary wick 191 facilitates conversion between liquid phase and vapor phase.

Referring to FIGS. 3 and 4, the integrated circuit chip cooling structure 10 is to be installed in a circuit board 51 to dissipate heat from a heat source 55 at the circuit board 51. During installation, the through holes 32 of the connecting members 31 are respectively aimed at respective through holes 53 in the circuit board 51, and then screw bolts 59 are respectively inserted through the through holes 53 of the circuit board 51 and the through holes 32 of the connecting members 31 from the bottom side and then threaded into the mounting holes 43 of the heat sink 41 to fixedly secure the heat sink 41, the plate members 11 and 21 and the circuit board 51 together. When installed, the feet 37 of the connecting members 31 space the bottom plate member 21 from the top surface of the circuit board 51 at a vertical distance fitting the height of the heat source 55. The feet 37 support the integrated circuit chip cooling structure 10 firmly on the circuit board 51.

Figure 5:
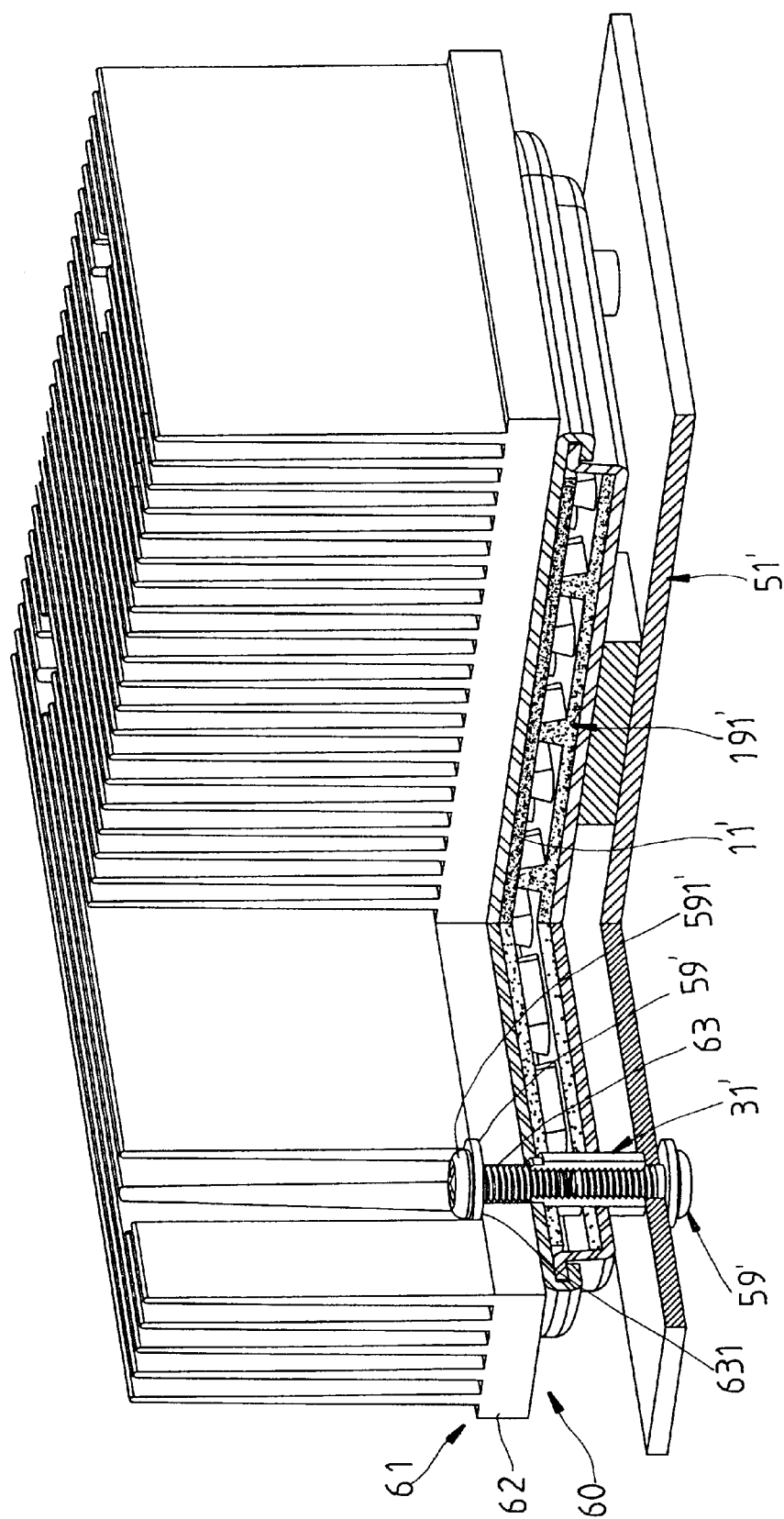
FIG. 5 shows an application example of the second embodiment of the present invention.

FIG. 5 shows an integrated circuit chip cooling structure 60 according to the second embodiment of the present invention. This embodiment is similar to the aforesaid first embodiment with the exception of the heat sink. According to this embodiment, the base panel 62 of the heat sink 61 has a bearing portion 631 integral with the top surface around each mounting hole 63. A screw bolt 59' is mounted in each mounting hole 63 to fix the heat sink 61 to the top plate member 11', keeping the head 591' of the screw bolt 59' supported on the bearing portion 631 around the respective mounting hole 63. As illustrated in FIG. 5, the top and bottom ends of each connecting member 31' is mounted with a respective screw bolt 59', wherein the top screw bolt 59' fixes the heat sink 61 to the top plate member 11'; the bottom screw bolt 59' fixes the integrated circuit chip cooling structure to the circuit board 51'. This embodiment achieves a strong mounting effect same as the aforesaid first embodiment. Because the use and structural concept of this second embodiment are same as the aforesaid first embodiment, nor further detailed description in these regards is necessary.

Figure 6:
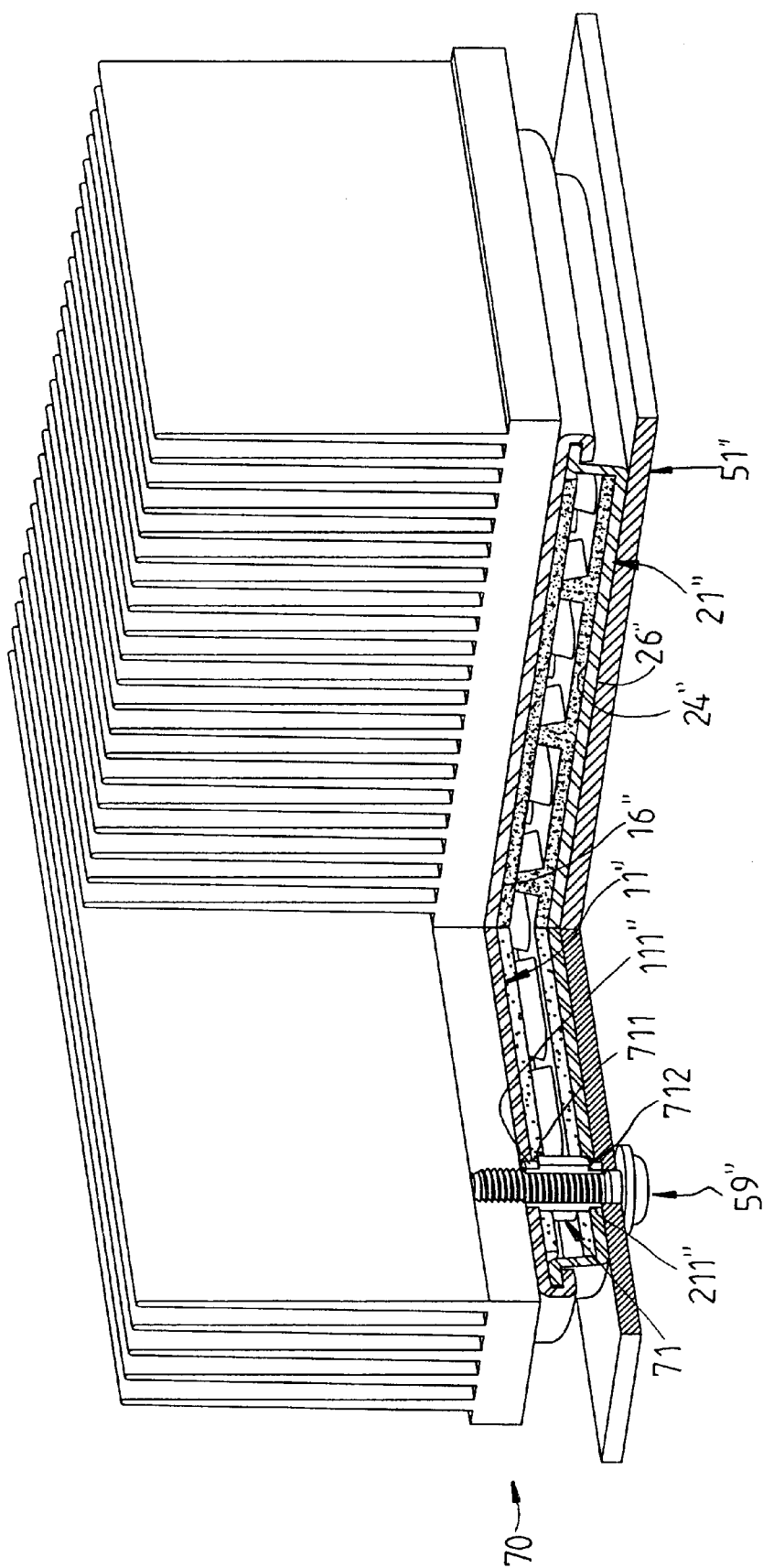
FIG. 6 shows an application example of the third embodiment of the present invention.

FIG. 6 shows an integrated circuit chip cooling structure 70 according to the third embodiment of the. present invention. According to this embodiment, each connecting member 71 has a top shoulder 711 and a bottom shoulder 712. The top shoulder 711 is bonded to the bottom surface 16" of the top plate member 11" around the corresponding through hole 111". The bottom shoulder 712 is bonded to the top surface 24" of the bottom plate member 21" around the corresponding through hole 211". Further, the bottom end of each connecting member 71 is disposed in flush with the bottom surface 26" of the bottom plate member 21", so that the integrated circuit chip cooling structure 70 directly dissipates heat from the circuit board 51". This embodiment achieves a strong mounting effect same as the aforesaid first embodiment. Because the use and structural concept of this second embodiment are same as the aforesaid first embodiment, nor further detailed description in these regards is necessary.

According to the aforesaid three embodiments, the invention achieves high stability and good connection status when installed. Further, the installation of the integrated circuit chip cooling structure is easy. Simply by fastening respective screw bolts 59 to the connecting members 31, the installation of the integrated circuit chip cooling structure is done.

A prototype of integrated circuit chip cooling structure has been constructed with the features of FIGS. 1~6. The integrated circuit chip cooling structure functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. An integrated circuit chip cooling structure comprising:
   a top plate member, said top pate member having an edge lip that bounds a top surface and a bottom surface of the top plate member;
   a bottom plate member, said bottom plate member having an edge lip that bounds a top surface and a bottom surface of the bottom plate member, the edge lips of said top and bottom plate members being bonded together so as to define a vapor chamber between said top and bottom plate members;
   wherein said top plate member and said bottom plate member each have at least one through hole, the at least one through hole of said top plate member and the at least one through hole of said bottom plate member being respectively vertically aligned;
   at least one connecting member extending between said top plate member and said bottom plate member, said connecting member having a top end sealed to a periphery of the through hole of said top plate member and a bottom end sealed to a periphery of the through hole of said bottom plate member, said at least one connecting member having a through hole extending through the connecting member from the top end to the bottom end for receiving a fastener;
   at least one heat sink, said at least one heat sink having a bottom surface attached to the top surface of said top plate member and at least one mounting hole respectively connected to the through hole of said at least one connecting member, said fastener extending through said through holes of said top plate member, said bottom plate member, and said connecting member, and through said mounting hole of said at least one heat sink, to secure said heat sink to said top and bottom plate members; and
   an internally sintered metal capillary wick provided within said vapor chamber.

2. The integrated circuit chip cooling structure as claimed in claim 1, wherein said at least one connecting member each has a top shoulder disposed near the top end and bonded to the bottom surface of said top plate member around one through hole of said top plate member.

3. The integrated circuit chip cooling structure as claimed in claim 2, wherein said at least one connecting member each has the respective bottom end downwardly extended out of said bottom plate member through one through hole of said bottom plate member at a distance and terminating in a foot.

4. The integrated circuit chip cooling structure as claimed in claim 1, wherein said at least one heat sink each is comprised of a base panel and a plurality of radiation fins located on one side of said base panel.

5. The integrated circuit chip cooling structure as claimed in claim 4, wherein said at least one heat sink each has a bearing portion integral with a top surface thereof around each mounting hole of the respective heat sink.

6. The integrated circuit chip cooling structure as claimed in claim 1, wherein the at least one mounting hole of each of said at least one heat sink each is a screw hole.

7. The integrated circuit chip cooling structure as claimed in claim 1, wherein said at least one connecting member each has a top shoulder disposed near the top end and bonded to the bottom surface of said top plate member around one through hole of said top plate member an d a bottom shoulder disposed near the bottom end and bonded to the top surface of said bottom plate member around one through hole of said bottom plate member.

8. The integrated circuit chip cooling structure as claimed in claim 1, wherein said internally sintered metal capillary wick comprises an upper plate-like wick element located on the bottom surface of said top plate member, a bottom plate-like wick element located on the top surface of said bottom plate member, and a plurality of vertical wick element provided between said upper plate-like wick element and said bottom plate-like wick element, said vertical wick elements each having a first end integral with one of said top and bottom plate members and a second end supported on the other of said top and bottom plate members; said at least one connecting member is inserted through said top plate-like wick element and said bottom plate-like wick element.

* * * * *